United States Patent
Horng et al.

(10) Patent No.: US 7,781,785 B2
(45) Date of Patent: Aug. 24, 2010

(54) LIGHT EMITTING DIODE WITH PLATED SUBSTRATE AND METHOD FOR PRODUCING THE SAME

(75) Inventors: Ray-Hua Horng, Taichung (TW); Dong-Sing Wu, Taichung (TW); Shao-Hua Huang, Ping-Chen (TW); Chi-Ying Chiu, Nan-Tou Hsien (TW); Yann-Jyh Chiang, Taichung (TW)

(73) Assignee: National Chung-Hsing University, Taichung (TW)

( * ) Notice: Subject to any disclaimer, the term of this patent is extended or adjusted under 35 U.S.C. 154(b) by 0 days.

(21) Appl. No.: 10/668,555

(22) Filed: Sep. 22, 2003

(65) Prior Publication Data

US 2004/0079951 A1    Apr. 29, 2004

(30) Foreign Application Priority Data

Oct. 25, 2002    (TW) ............................... 91125402 A

(51) Int. Cl.
  *H01L 33/00*    (2010.01)
(52) U.S. Cl. ..................... 257/94; 257/96; 257/98; 257/99; 257/103; 257/E33.026; 257/E33.056; 257/E33.068; 257/E33.075

(58) Field of Classification Search .............. 257/94, 257/96, 98, 99, 103, E33.001, E33.026, E33.056, 257/E33.068, E33.075
See application file for complete search history.

(56) References Cited

U.S. PATENT DOCUMENTS

| 5,696,389 | A  | * | 12/1997 | Ishikawa et al. | ............... | 257/99 |
| 5,869,849 | A  | * | 2/1999  | Jou et al.      | ............... | 257/96 |
| 6,468,824 | B2 | * | 10/2002 | Chen et al.     | ............... | 438/46 |
| 6,649,437 | B1 | * | 11/2003 | Yang et al.     | ............... | 438/30 |
| 2003/0155579 | A1 | * | 8/2003 | Yang          | ............... | 257/88 |
| 2003/0231683 | A1 | * | 12/2003 | Chua et al.   | ............... | 372/46 |

FOREIGN PATENT DOCUMENTS

JP        08250804    A    *    9/1996

\* cited by examiner

*Primary Examiner*—David S Blum
(74) *Attorney, Agent, or Firm*—Charles E. Baxley

(57) ABSTRACT

The present invention discloses a light emitting diode having a mirror and a permanent substrate plated thereon. The present invention also discloses a method for producing such light emitting diode. The permanent substrate and the mirror are formed after both electrodes are completed. Accordingly, the epitaxial structure and the mirror will not be damaged, and brightness and heat dissipation of the light emitting device are improved.

16 Claims, 4 Drawing Sheets

LIGHT EMITTING DIODE WITH PLATED SUBSTRATE AND METHOD FOR PRODUCING THE SAME

BACKGROUND OF THE INVENTION

1. Field of the Invention

The present invention relates to a light emitting diode, which particularly includes a permanent substrate plated beneath a mirror. The present invention also relates to a method for producing such high brightness light emitting diode.

2. Related Prior Arts

Currently, light emitting diodes (LEDs) are one of the most important light sources. The conventional procedures for producing LEDs are primarily to epitaxy a layered light emitting structure with pn junction on a GaAs substrate. The wafer is then bonded to a transparent substrate or a substrate with a mirror at high temperature. For bonding to the transparent substrate, processing temperature above 500° C. is necessary, and therefore the epitaxial structure is easily damaged. Certainly, the bonding yields and heat dissipation for the high power LED applications are not satisfied. As for bonding to the substrate with a mirror, the processing temperature is usually above 300° C., which also destroys the mirror and reduces reflectivity thereof.

R.O.C. Patent Application No. 477,079 disclosed a method for producing a semiconductor device having a permanent metal substrate formed by means of plating or sputtering. In this patent, at least one electrode is formed after the permanent metal substrate is completed. Therefore, damage and crack of the metal substrate and the epitaxial structure occur due to obvious difference between their coefficients of thermal expansion. Moreover, a metal substrate is temporarily deposited or plated on a semiconductor structure, and then removed after the permanent substrate is formed. In practice the epitaxial structure is also damaged during removal of the temporary metal substrate. In other words, it's difficult to form electrodes on opposite sides of an LED with a metal substrate.

Accordingly, it is desirable to provide an improved method for producing an LED with a plated substrate to mitigate and/or obviate the aforementioned problems.

SUMMARY OF THE INVENTION

The major object of the present invention is to provide a light emitting diode with a plated substrate and a method for producing the same, which performs high brightness and needs low cost.

Another object of the present invention is to provide a high brightness light emitting diode with good heat dissipation.

The method of the present invention primarily first provides a substrate with an LED epitaxial structure thereon. The LED epitaxial structure includes a second cladding layer, an active layer, a first cladding layer, a window, and a metal contact layer sequentially formed on the substrate. This substrate can be made from GaAs, sapphire or InP. The LED epitaxial structure is preferably made from II-VI or III-V compounds with direct-bandgap.

Next, the LED epitaxial structure is etched to expose the second cladding layer. A first electrode and a second electrode are then respectively formed on the metal contact layer and the exposed cladding layer. Between the LED epitaxial structure and the first electrode, a transparent conductive film can be further added to improve current spreading. After rapid thermal annealing is completed for ohmic contact of the electrodes, a temporary substrate is bonded to the LED epitaxial structure and the first electrode. Consequently, the substrate for epitaxing can be removed.

To enhance brightness of the light emitting device, a mirror is formed beneath the LED epitaxial structure by means of evaporation, sputtering or ion beam sputtering. The mirror can be a metal capable of forming high bandgap with the LED epitaxial structure, or a composite of a metal with low refractivity and an insulating layer with high refractivity. The insulating layer is adjacent to the LED epitaxial structure.

At last, a permanent substrate is plated beneath the mirror, and then the temporary substrate can be removed. Preferably, sawing streets of the wafer is retained without plating the substrate thereon.

According to the above procedures, the light emitting diode with the plated substrate is obtained and exhibits high brightness.

Other objects, advantages, and novel features of the invention will become more apparent from the following detailed description when taken in conjunction with the accompanying drawings.

DETAILED DESCRIPTION OF THE PREFERRED EMBODIMENTS

Figure 1:
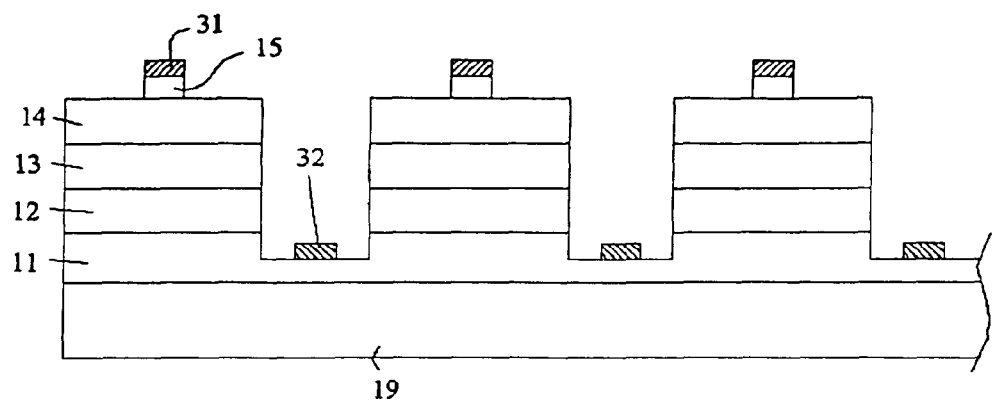
FIGS. 1-6 show the procedures for producing the light emitting diode of the present invention.

FIGS. 1-6 show the general procedures for producing the light emitting diode of the present invention. First, a GaAs substrate 19 with an LED epitaxial structure is provided. On the substrate 19, a second cladding layer 11, an active layer 12, a first cladding layer 13, a window 14, and a metal contact layer 15 are sequentially epitaxed. According to the size of dice and position of electrodes, the metal contact layer 15, the window 14, the first cladding layer 13, the active layer 12 and the upper portion of the second cladding layer 11 are partially etched to expose the second cladding layer 11, as shown in FIG. 1.

The LED epitaxial structure is made from II-VI or III-V compounds with direct-bandgap, for example, $Ga_xAl_yIn_{1-x-y}N$, $(Al_xGa_{1-x})_yIn_{1-y}P$, $In_xGa_{1-x}As$, and $ZnS_xSe_{1-x}$; wherein $0 \leq x \leq 1$, $0 \leq y \leq 1$. In the preferred embodiment of the present invention, the active layer 12 is undoped $(Al_xGa_{1-x})_yIn_{1-y}P$ with quantum well structure, the first cladding layer 13 is p-$(Al_xGa_{1-x})_yIn_{1-y}P$ or p-GaP, and the second cladding layer 11 is n-$(Al_xGa_{1-x})_yIn_{1-y}P$.

The first electrode 31 and the second electrode 32 are respectively formed on the metal contact layer 15 and the exposed second cladding layer 11. The metal contact layer 15 can be further etched to remain only the portion beneath the first electrode 31, so that the emitted light absorbed by the metal contact layer can be decreased.

Figure 2:
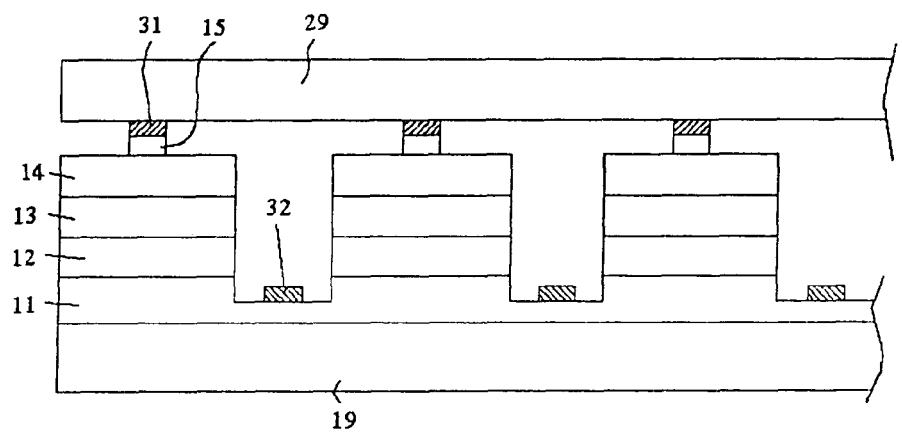
Figure 3:
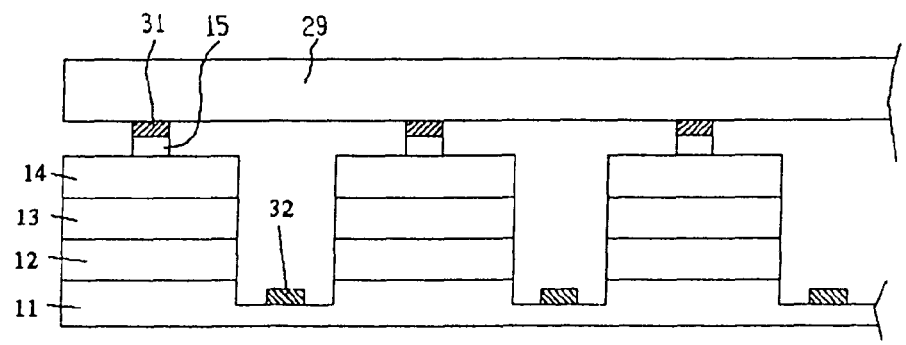

FIG. 2 shows the cross section of the LED in accordance with the present invention, in which a glass substrate 29 is bonded to the epitaxial layer. The glass substrate 29 is previously coated with epoxy or wax, and then attached to the wafer at 70-150° C. As this bonding procedure is performed at a low temperature, damage to the chip is prevented. Consequently, the GaAs substrate 19 is useless and can be removed by etching, as shown in FIG. 3.

Figure 4:
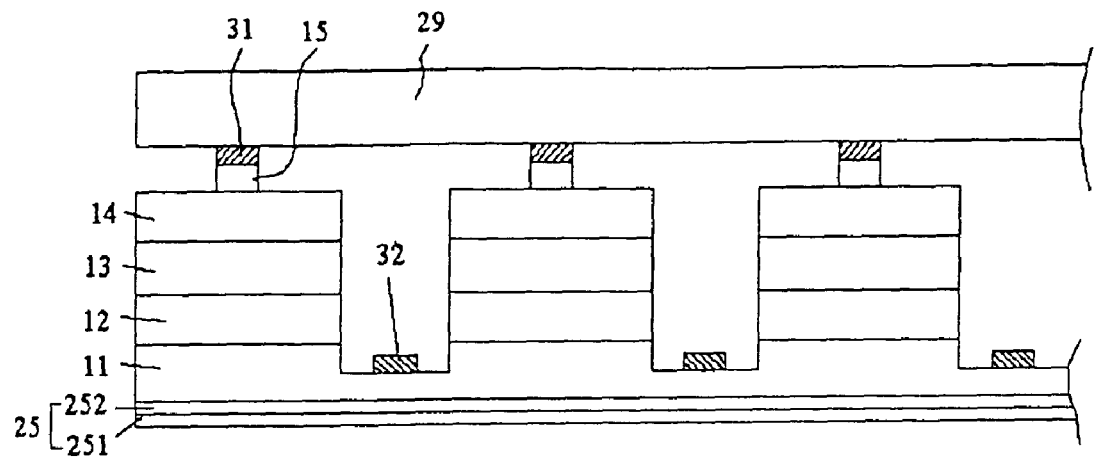

In order to further promote brightness of the LED, a mirror 25 is formed beneath the second cladding layer 11 by means of physical film deposition, as shown in FIG. 4. The mirror 25 in this embodiment is composed of a metal layer 251 with low refractivity and an insulating layer 252 with high refractivity. The metal layer 251 and the insulating layer 252 are respectively made from Al and $Al_2O_3$. In addition to $Al/Al_2O_3$, other composites such as $Al/SiO_2$, $Al/MgF_2$, $Pt/Al_2O_3$, $Pt/SiO_2$, $Pt/MgF_2$, $Al/Al_2O_3$, $Al/SiO_2$, $Al/MgF_2$, $AU/Al_2O_3$, $Au/SiO_2$, $Au/MgF_2$, $Ag/Al_2O_3$, $Ag/SiO_2$, $Ag/MgF_2$ can be applied, too. As shown in FIG. 4, the insulating layer 252 is adjacent to the LED epitaxial structure.

Figure 5:
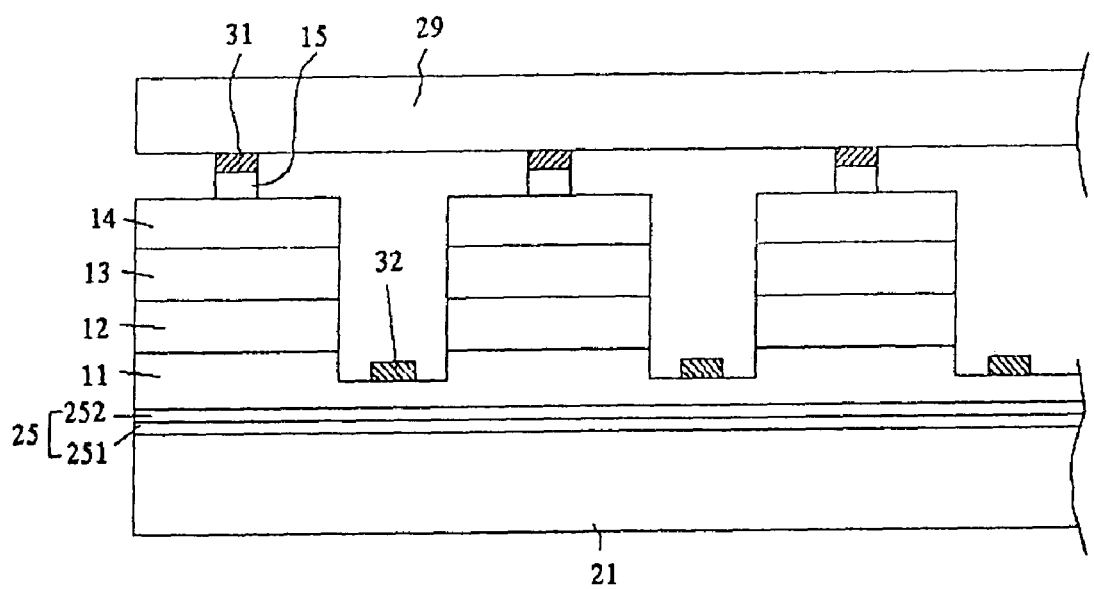
Figure 6:
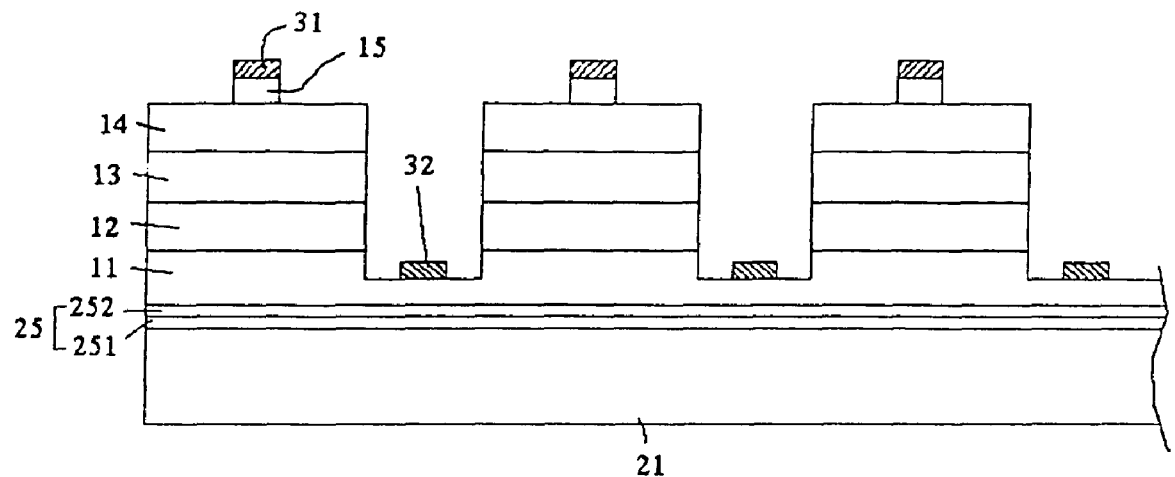

Next, the wafer with the mirror 25 is immersed in an electrolyte containing $Cu^{+2}$ to plate a copper substrate 21 beneath the metal layer 251 through a redox reaction. The copper substrate 21 is a permanent substrate and about 30 μm thick, as shown in FIG. 5. Optionally, a film of catalyst such as Pd, can be coated beneath the metal layer 251 to accelerate the reaction, that is electroless copper. In the present invention, the electrolyte is not restricted, and preferably not to corrode the semiconductor device, for example, copper cyanide. After completing the metal substrate, the glass substrate 29 can be easily removed at low temperature, and the high brightness LED of the present invention is obtained.

Furthermore, in order to meliorate current crowding effect and the opaque center of conventional LEDs, a transparent conductive film (not shown in drawings) such as an ITO film, can be added between the first electrode 31 and the metal contact layer 15.

Figure 7:
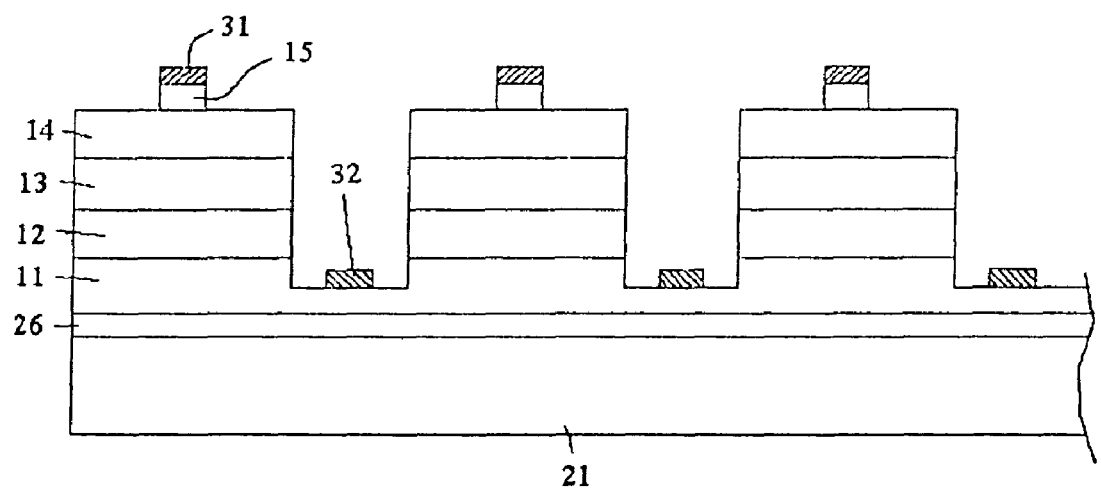
FIG. 7 shows the cross section of the second embodiment including a metal mirror.

FIG. 7 shows the cross section of the second embodiment, in which the composite mirror 25 is replaced with a silver mirror 26. Alternatively, other metals or alloys such as Pt, Au, Au/Zn, Au/Be, Au/Ge, Au/Ge/Ni, In, Sn, Al, Zn, Ge, Ni can be applied, too.

Figure 8:
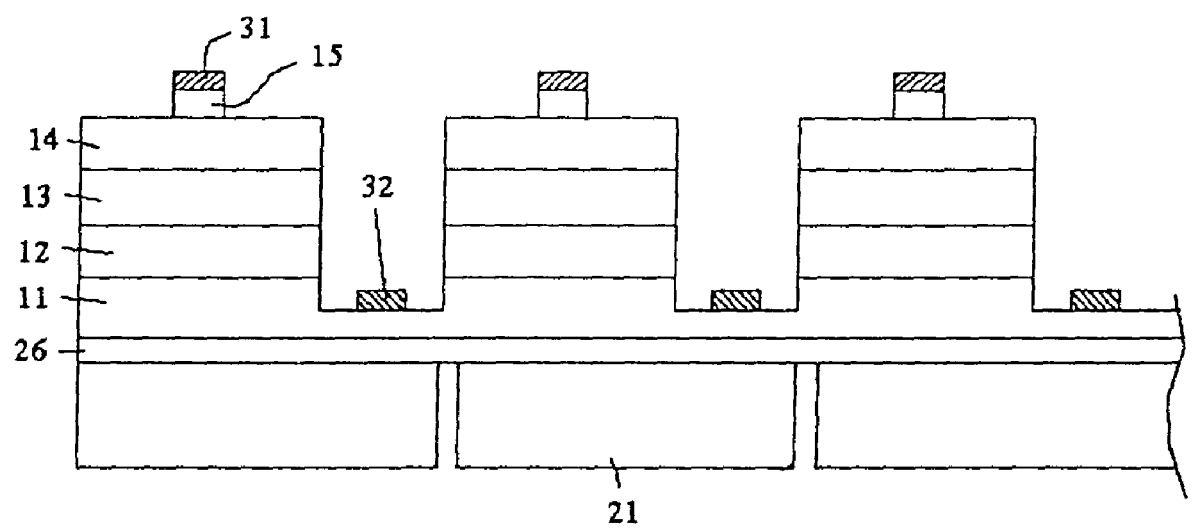
FIG. 8 shows the cross section of the third embodiment, in which the permanent substrate is partially plated beneath the mirror.

FIG. 8 shows the cross section of the third embodiment in accordance with the present invention. The substrate 21 is selectively plated beneath the mirror 26. That is, sawing streets for dicing are temporarily covered without plating copper thereon.

By plating the metal substrate, manufacture cost can be effectively reduced, and the production yield is promoted. Particularly, bonding at high temperature is not necessary, and reflectivity of the mirror can be reserved. For conventional procedures, the epitaxial structure is easily damaged during rapid thermal annealing due to difference between their coefficients of thermal expansion. In the present invention, the electrodes are completed before plating the metal substrate, which significantly prevents the above problem. Furthermore, the plated copper substrate also facilitates heat dissipation.

What is claimed is:

1. A light emitting diode having a plated substrate with a mirror, comprising:
    an LED epitaxial structure sequentially comprising a second cladding layer, an active layer, a first cladding layer, a window and a metal contact layer, wherein said second cladding layer is partially exposed,
    a first electrode formed on said metal contact layer;
    a second electrode formed on said exposed second cladding layer;
    a mirror formed beneath said LED epitaxial structure; and
    a copper substrate plated beneath said mirror and retaining sawing streets without plating the substrate thereon;
    wherein said mirror is made from a composite of a metal layer with low refractivity and an insulating layer with high refractivity, adjacent to the LED epitaxial structure, selected from the group consisting of:
    $Al/MgF_2$, $Pt/Al_2O_3$, $Pt/SiO_2$, $Pt/MgF_2$, $Au/SiO_2$, $Au/MgF_2$, $Ag/MgF_2$.

2. The light emitting diode as claimed in claim 1 further comprising a transparent conductive film between said first electrode and said metal contact layer.

3. The light emitting diode as claimed in claim 1, wherein the copper substrate is an electroless copper substrate with 30 μm thick.

4. The light emitting diode as claimed in claim 1 further comprising a film of Pd, coated beneath the metal layer of the mirror, to accelerate the reaction of electroless copper substrate.

5. The light emitting diode as claimed in claim 1, wherein said metal contact layer remains only the portion beneath the first electrode.

6. A light emitting diode having a plated substrate with a mirror, comprising:
    an LED epitaxial structure sequentially comprising a second cladding layer, an active layer, a first cladding layer, a window and a metal contact layer, wherein said second cladding layer is partially exposed;
    a first electrode formed on said metal contact layer;
    a second electrode formed on said exposed second cladding layer;
    a mirror formed beneath said LED epitaxial structure; and
    a copper substrate plated beneath said mirror and retaining sawing streets without plating the substrate thereon;
    wherein said metal contact layer remains only the portion beneath the first electrode;
    wherein said mirror is made from a composite of a metal layer with low refractivity and an insulating layer with high refractivity, adjacent to said LED epitaxial structure, selected from the group consisting of:
    $Al/MgF_2$, $Pt/Al_2O_3$, $Pt/SiO_2$, $Pt/MgF_2$, $Au/SiO_2$, $Au/MgF_2$, $Ag/MgF_2$.

7. The light emitting diode as claimed in claim 6, wherein said copper substrate is formed by using electroless plating.

8. The light emitting diode as claimed in claim 6, wherein said copper substrate is about 30 μm thick.

9. The light emitting diode as claimed in claim 6 further comprising a transparent conductive film between said first electrode and said metal contact layer.

10. The light emitting diode as claimed in claim 7 further comprising a film of Pd, coated beneath the metal layer of the mirror, to accelerate the reaction of electroless copper substrate.

11. A light emitting diode having a plated substrate with a mirror, comprising:
    an LED epitaxial structure sequentially comprising a second cladding layer, an active layer, a first cladding layer, a window and a metal contact layer, wherein said second cladding layer is partially exposed;
    a first electrode formed on said metal contact layer;
    a second electrode formed on said exposed second cladding layer;
    a mirror formed beneath said LED epitaxial structure; and
    an electroless copper substrate plated beneath said mirror and retaining sawing streets without plating the substrate thereon;
    wherein said metal contact layer remains only the portion beneath the first electrode;
    wherein the light emitting diode further comprising a film of Pd, coated beneath the metal layer of the mirror, to accelerate the reaction of electroless copper substrate.

12. The light emitting diode as claimed in claim 11, wherein said electroless copper substrate is about 30 μm thick.

13. The light emitting diode as claimed in claim 11, further comprising a transparent conductive film between said first electrode and said metal contact layer.

14. The light emitting diode as claimed in claim 11, wherein said metal contact layer remains only the portion beneath the first electrode.

15. The light emitting diode as claimed in claim 11, wherein said mirror is made from a composite of a metal layer with low refractivity and an insulating layer with high refractivity selected from the group consisting of:

$Al/MgF_2$, $Pt/Al_2O_3$, $Pt/SiO_2$, $Pt/MgF_2$, $Au/SiO_2$, $Au/MgF_2$, $Ag/MgF_2$.

16. The light emitting diode as claimed in claim 15, wherein said composite of a metal layer with low refractivity and an insulating layer with high refractivity is $Au/SiO_2$.

* * * * *